(12) United States Patent
Grivna

(10) Patent No.: US 7,045,845 B2
(45) Date of Patent: May 16, 2006

(54) SELF-ALIGNED VERTICAL GATE SEMICONDUCTOR DEVICE

(75) Inventor: Gordon M. Grivna, Mesa, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 273 days.

(21) Appl. No.: 10/219,190

(22) Filed: Aug. 16, 2002

(65) Prior Publication Data

US 2004/0031981 A1 Feb. 19, 2004

(51) Int. Cl.
*H01L 27/108* (2006.01)

(52) U.S. Cl. .............. 257/302; 257/297; 257/298; 257/314; 257/315; 438/268; 438/269; 438/273

(58) Field of Classification Search ............ 438/268, 438/269, 273; 257/297, 298, 314, 315

See application file for complete search history.

(56) References Cited

U.S. PATENT DOCUMENTS

| 6,051,456 A | 4/2000 | Davies et al. |
| 6,110,783 A | 8/2000 | Burr |
| 6,153,905 A | 11/2000 | Davies et al. |
| 6,197,640 B1 * | 3/2001 | Davies .................. 438/268 |
| 6,268,626 B1 | 7/2001 | Jeon |

FOREIGN PATENT DOCUMENTS

JP  06163906  6/1994

* cited by examiner

*Primary Examiner*—Son Mai
*Assistant Examiner*—Mai-Huong Tran
(74) *Attorney, Agent, or Firm*—James J. Stipanuk; Kevin B. Jackson

(57) ABSTRACT

A transistor (10) is formed in a semiconductor substrate (12) whose top surface (48) is formed with a pedestal structure (24). A conductive material (40) is disposed along a side surface (28) of the pedestal structure to self-align an edge of a first conduction electrode (45) of the transistor. A dielectric spacer (55) is formed along a side surface (49) of the conductive material to self-align a contact area (56) of the first conduction electrode.

20 Claims, 5 Drawing Sheets

SELF-ALIGNED VERTICAL GATE SEMICONDUCTOR DEVICE

BACKGROUND OF THE INVENTION

The present invention relates in general to semiconductor devices and, more particularly, to vertical gate transistors.

There is a continuing demand for semiconductor devices with a higher level of performance and a lower manufacturing cost. For example, manufacturers of switching regulators are demanding mote efficient power MOSFET transistors for switching the inductor currents that develop the regulated output voltages. Higher efficiency is achieved by utilizing transistors with shorter channels to provide a higher frequency response that reduces the switching losses of the regulator.

However, most if not all previous high frequency power transistors require advanced photolithographic equipment capable of resolving small feature sizes in order to provide the shorter length channels necessary to reduce switching losses. Some previous high frequency transistors are formed with vertical gate structures in which the channel lengths are defined by the thickness of the deposited gate electrode rather than a feature size of a photolithographic tool. This approach reduces the need for expensive photolithographic equipment, which reduces the cost of building the devices. However, previous vertical gate devices require numerous masking steps and a complex sequence of processing steps, which reduces the die yield and increases the manufacturing cost of the devices.

Hence, there is a need for a semiconductor device with a short channel to operate at a high frequency and efficiency, and which can be made with a simple sequence of processing steps to avoid the need for expensive manufacturing equipment.

DETAILED DESCRIPTION OF THE DRAWINGS

In the figures, elements having the same reference number have similar functionality. As used herein, the term current carrying or conduction electrode refers to an element of a device that carries current through the device such as a source or a drain of a field-effect transistor or an emitter or a collector of a bipolar transistor.

Figure 1:
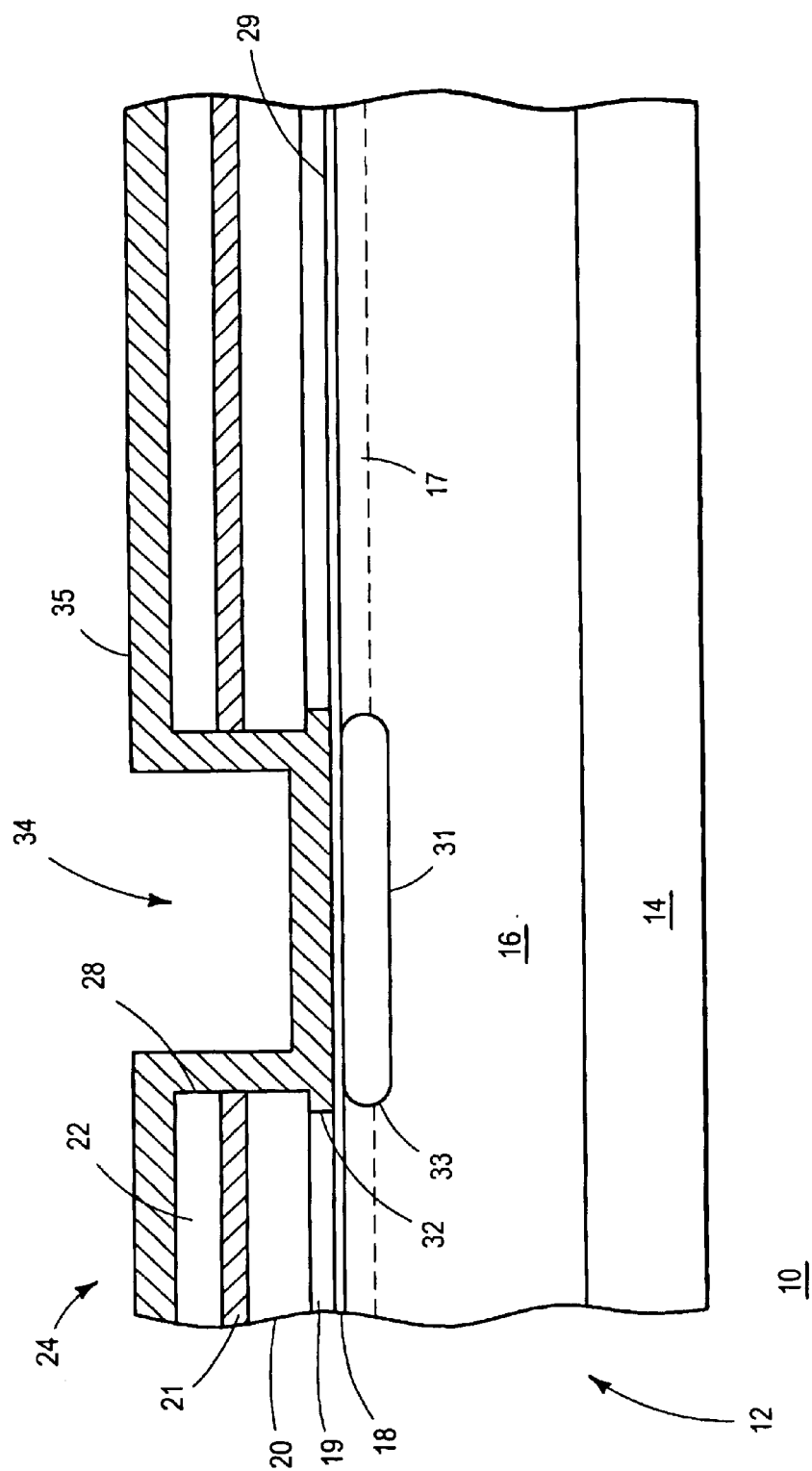
FIG. 1 is a cross-sectional view of a semiconductor device after a first fabrication stage.

FIG. 1 is a cross-sectional view of a cell of a semiconductor device 10 formed with a semiconductor substrate 12 after a first processing stage. In one embodiment, semiconductor device 10 operates as a switching metal-oxide-semiconductor field effect transistor operating at a current greater than one ampere.

A base layer 14 is formed to have a thickness of about two hundred fifty micrometers. In one embodiment, base layer 14 is heavily doped to have an n-type conductivity and a resistivity of about 0.01 ohm-centimeters to provide a low on-resistance for semiconductor device 10. In one embodiment, base layer 14 comprises monocrystalline silicon.

An epitaxial layer 16 is grown to a thickness of about three micrometers over base layer 14. In one embodiment, epitaxial layer 16 comprises monocrystalline silicon doped to have an n-type conductivity and a doping concentration of about $3.0*10^{16}$ atoms/centimeter$^3$.

A blanket n-type implant is applied to substrate 12 to produce a region 17 whose doping concentration is about $1.0*10^{17}$ atoms/centimeter$^3$ to prevent a low voltage breakdown due to drain pinchoff. In one embodiment, region 17 is formed to a depth of about 0.5 micrometers.

A gate dielectric layer 18 is formed over epitaxial layer 16 to a thickness of about three hundred fifty angstroms. In one embodiment, dielectric layer 18 is formed with a thermally grown silicon dioxide.

A dielectric layer 19 is formed over dielectric layer 18 to a thickness of about one thousand five hundred angstroms. In one embodiment, dielectric layer 19 comprises silicon nitride.

A dielectric layer 20 is formed over dielectric layer 19 to a thickness of about six thousand angstroms. In one embodiment, dielectric layer 20 is formed with a tetra-ethyl orthosilicate (TEOS) process to form a deposited silicon dioxide.

A conductive semiconductor layer 21 is deposited over dielectric layer 20 to a thickness of about one thousand eight hundred angstroms. In one embodiment, semiconductor layer 21 comprises polycrystalline silicon which is heavily doped to provide a low resistance. Semiconductor layer 21 may include a film of platinum, tungsten or titanium silicide or similar material to provide an even lower resistance.

A dielectric layer 22 is formed over semiconductor layer 21 to a thickness of about four thousand angstroms. In one embodiment, dielectric layer 22 is formed with a TEOS process to comprise a deposited silicon dioxide.

A surface 29 of substrate 12 is patterned in a first photoresist step to mask a series of standard etch steps that successively remove exposed portions of dielectric layer 22, semiconductor layer 21 and dielectric layers 19 and 18 to form a raised pedestal structure 24. A recessed region 34 adjacent to pedestal structure 24 is bounded by vertical walls or surfaces 28 which typically are separated by a distance ranging between two and three micrometers, approximately, depending on the subsequent film thicknesses and desired voltage breakdown.

Vertical walls 28 are used to mask or define an implant into a body region 31 of substrate 12 that inverts to form a channel of semiconductor device 10 as described below. Hence, body region 31 is self-aligned to vertical walls 28.

An isotropic silicon nitride etch is then applied to undercut dielectric layer 19 to recess its vertical surface 32 relative to vertical walls 28. Recessing surface 32 in this fashion ensures that a channel (not shown) formed in body region 31 extends to a boundary or edge 33 of body region 31 to allow channel current to flow into epitaxial layer 14. Recessing vertical surface 32 also increases the operating voltage of semiconductor device 10 by increasing its channel length. In one embodiment, dielectric layer 19 is recessed a distance of about 0.1 micrometers.

A semiconductor layer 35 is deposited on substrate 12 as shown to a thickness of about four thousand angstroms. Semiconductor layer 35 typically is doped to have the same conductivity type as semiconductor layer 21 and a low resistance. Note that semiconductor layers 21 and 35 are electrically coupled to each other along vertical wall 28.

Figure 2:
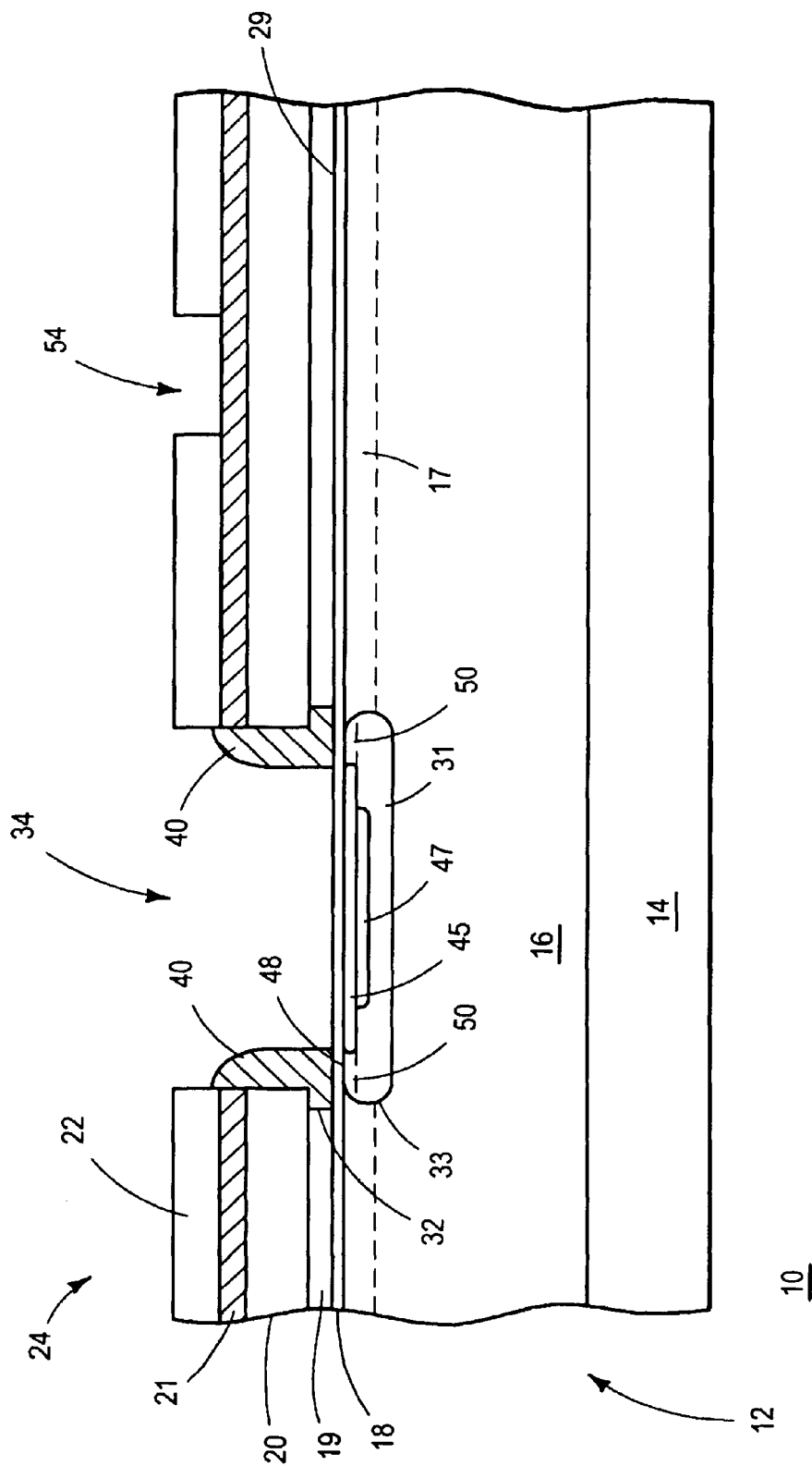
FIG. 2 is a cross-sectional view of the semiconductor device after a second fabrication stage.

FIG. 2 is a cross-sectional view of semiconductor device 10 after a second fabrication stage. An anisotropic etch is applied to semiconductor layer 35 to form spacers adjacent to pedestal structure 24 operating as vertical gates 40. A vertical gate refers to a control electrode formed with a gate material deposited on a first surface to control a conduction channel formed on a second surface perpendicular to the first surface. In the case of semiconductor device 10, channels 50 are formed at a surface 48 of body region 31, which is considered to be a horizontal surface. The control electrode film, i.e., semiconductor layer 35, is deposited along walls 28, which run perpendicular to surface 48 and therefore are referred to a vertical walls 28. As a result, the channel length is determined by the thickness of the vertical gate 40 film. Hence, a control signal applied to vertical gates 40 causes body region 31 to invert at top surface 48 to form channels 50 with a length about equal to the thickness of semiconductor layer 35.

Once vertical gates 40 are formed, a thin thermal oxide is grown on exposed semiconductor surfaces to prevent contamination or static charge from accumulating through surfaces of vertical gates 40 during subsequent processing. In one embodiment, this process step results in about one hundred angstroms of silicon dioxide being grown on vertical gates 40.

Note that a bipolar transistor with vertical gate 40 functioning as a base electrode can be formed by omitting the etch step that recesses dielectric layer 19 and etching dielectric layer 18 to deposit semiconductor layer 35 directly on body region 31. After semiconductor layer 35 is anisotropically etched, vertical gates 40 are electrically coupled to body region 31 to form a base of the bipolar transistor. Subsequent processing is as described below, with the source and drain operating as the emitter and collector, respectively, of the bipolar device.

In a second photoresist step, dielectric layer 22 is patterned and etched to form a gate contact 54 as shown.

A blanket implant is then applied to semiconductor device 10 to form a source region 45 that is defined by, or self-aligned to, vertical gates 4Q. The blanket implant also dopes gate contact 54 to reduce its contact resistance In one embodiment, source region has an n-type conductivity and a doping concentration between about $10^{19}$ and about $10^{20}$ atoms/centimeter$^3$.

Note that source region 45 defines one end of channel 50 and boundary 33 of body region 31 defines the other end. Since boundary 33 is self-aligned to vertical wall 28 and source region 45 is self-aligned to vertical gate 40, the length of channel 50 is substantially determined by the thickness of the vertical gate 40 film. In one embodiment, channel 50 has an effective length of about 0.4 micrometers, while the smallest feature size of the photolithographic processes used to this point may be as large as about three micrometers. Hence, a short channel is formed using a less expensive photolithographic tool, thereby providing a high frequency performance at a reduced cost. Moreover, performance is more consistent because the film thicknesses can be controlled more precisely than can the dimensions of surface features defined by masking.

Figure 3:
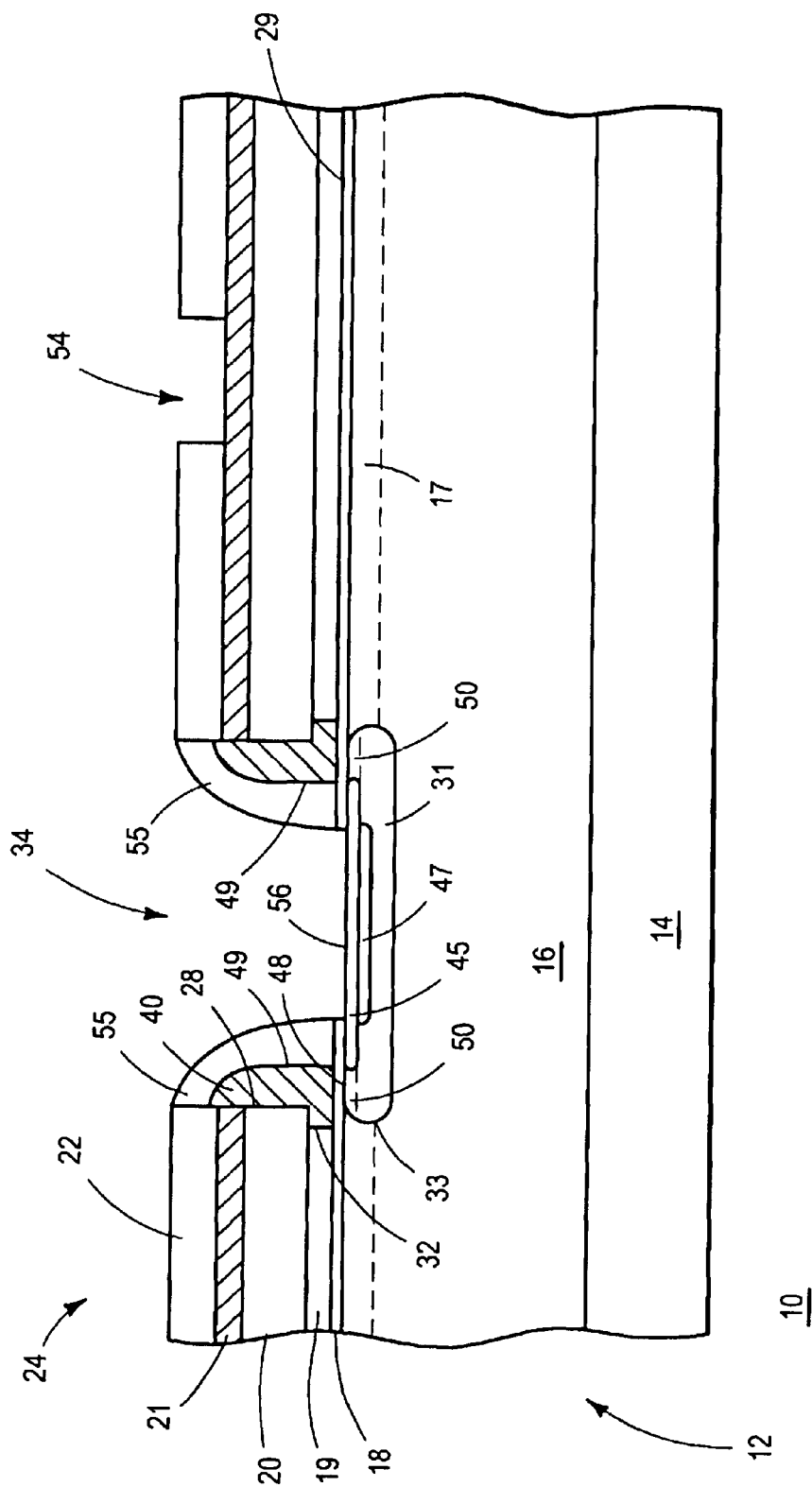
FIG. 3 is a cross-sectional view of the semiconductor device after a third fabrication stage.

FIG. 3 shows a cross-sectional view of integrated circuit 10 after a third fabrication stage. A dielectric material is deposited on semiconductor substrate 12 and anisotropically etched to produce dielectric spacers 55 adjacent to side surfaces 49 of vertical gates 40. The dielectric material preferably is deposited with a film thickness greater than the thickness of semiconductor layer 35 in order to ensure that thinning of dielectric spacers 55 over topographic steps does not result in exposing vertical gates 40 during the anisotropic etch step. For example, in an embodiment where semiconductor layer 35 has a thickness of about four thousand angstroms, the dielectric material used to form spacers 55 has a thickness of about five thousand angstroms. The anisotropic etch also clears dielectric material from exposed portions of dielectric layer 18 to define a source contact 56 over source region 45 that is self-aligned to dielectric spacers 55

Spacers 55 are also used to mask a p-type blanket implant step that produces an enhancement region 47 under source region 45 as shown. Enhancement region 47 provides a low resistance path that maintains body region 31 at a constant potential in all regions of semiconductor device 10. In an alternate embodiment, enhancement region 47 may be formed in selected regions on surface 48 by using an additional photomask step to block the source implant into the selected regions.

Figure 4:
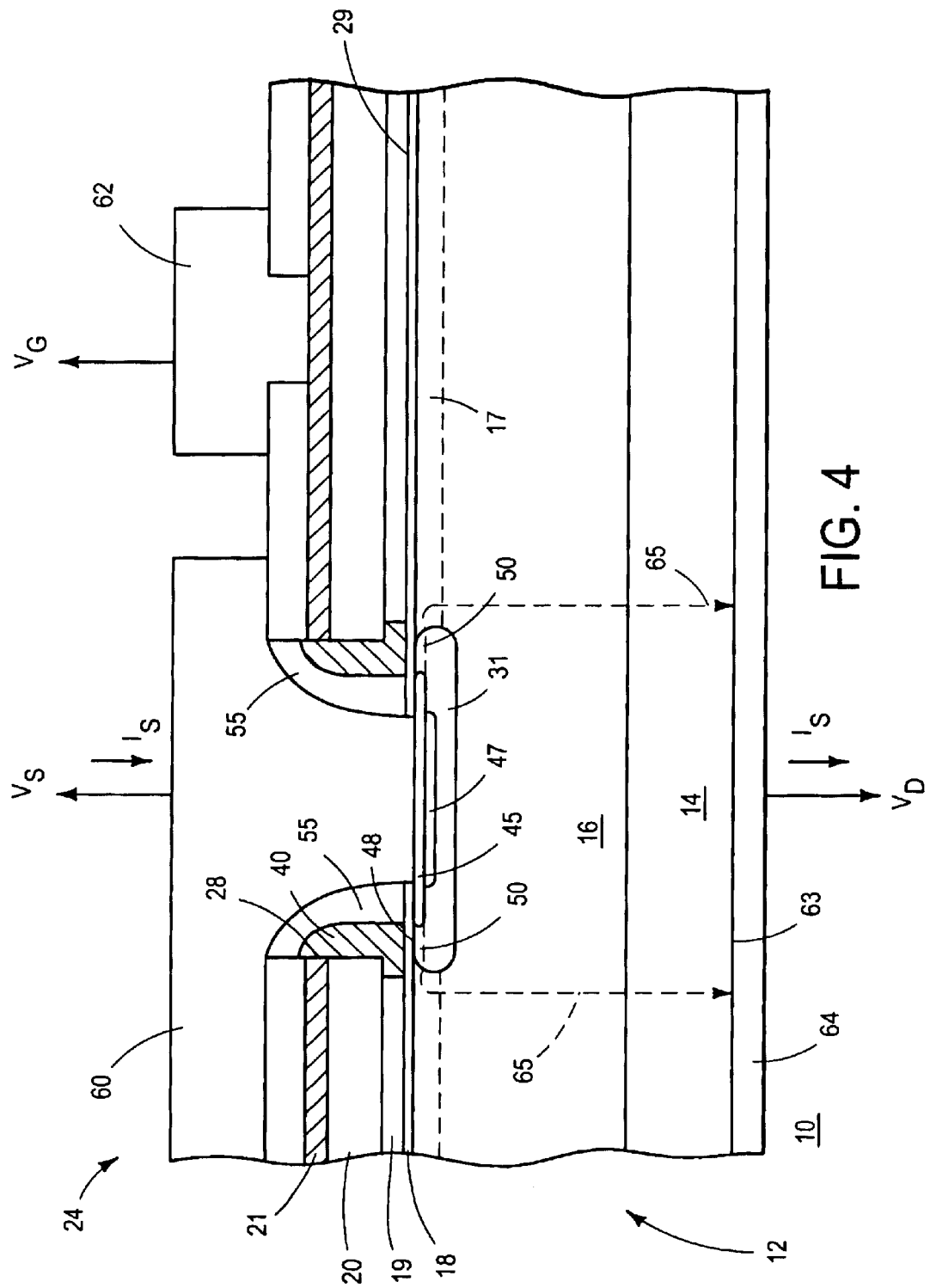
FIG. 4 is a cross-sectional view of the semiconductor device after a fourth fabrication stage.

FIG. 4 is a cross-sectional view of semiconductor device 10 after a fourth fabrication stage.

A standard semiconductor metal film is deposited on surfaces of substrate 12. In one embodiment, a thin layer of platinum is deposited and annealed to form a platinum silicide layer that provides a low resistance electrical connection to the semiconductor material exposed in gate contact 54 and source contact 56. A titanium layer is formed to a thickness of one hundred twenty angstroms followed by an eight hundred angstrom barrier layer of titanium nitride. Finally, a layer of aluminum is deposited with a thickness between three and four micrometers.

A third photoresist step is used to pattern the metal film to form a source terminal 60 and a gate terminal 62. A similar blanket metal film is deposited on bottom surface 63 of substrate 12 to form a drain terminal 64 with a thickness between three and four micrometers.

A passivation layer (not shown) is deposited and patterned to produce a finished device. Note that additional masking steps may be included to provide additional or different features. For example, one additional photomasking step may be used to form semiconductor device 10 as a lateral or planar device, rather than a vertical one, by patterning a drain electrode and/or terminal on the same surface as the source electrode/terminal. As a further example, for high voltage applications, an additional photomask may be used to pattern a field shaping region around semiconductor device 10.

The vertical structure of semiconductor device 10 can be appreciated by referring to its standard mode of operation. Assume that source terminal 60 is operating at a potential $V_s$ of zero volts, gate terminal 62 receives a control voltage $V_G$=2.5 volts which is greater than the conduction threshold of semiconductor device 10, and drain terminal 64 operates at a drain potential $V_D$=5.0 volts. The values of $V_G$ and $V_s$ cause body region 31 to invert under vertical gate 40 to form channel 50 to electrically connect source region 45 to epitaxial layer 16. A device current Is flows from source terminal 60 and is routed through source region 45, channel 50, region 17, epitaxial region 16 and base layer 14 to drain terminal 64, generally along dashed lines 65 as shown. Hence, current Is flows vertically through substrate 12 to produce a low on resistance. In one embodiment, $I_s$=1.0 amperes.

Figure 5:
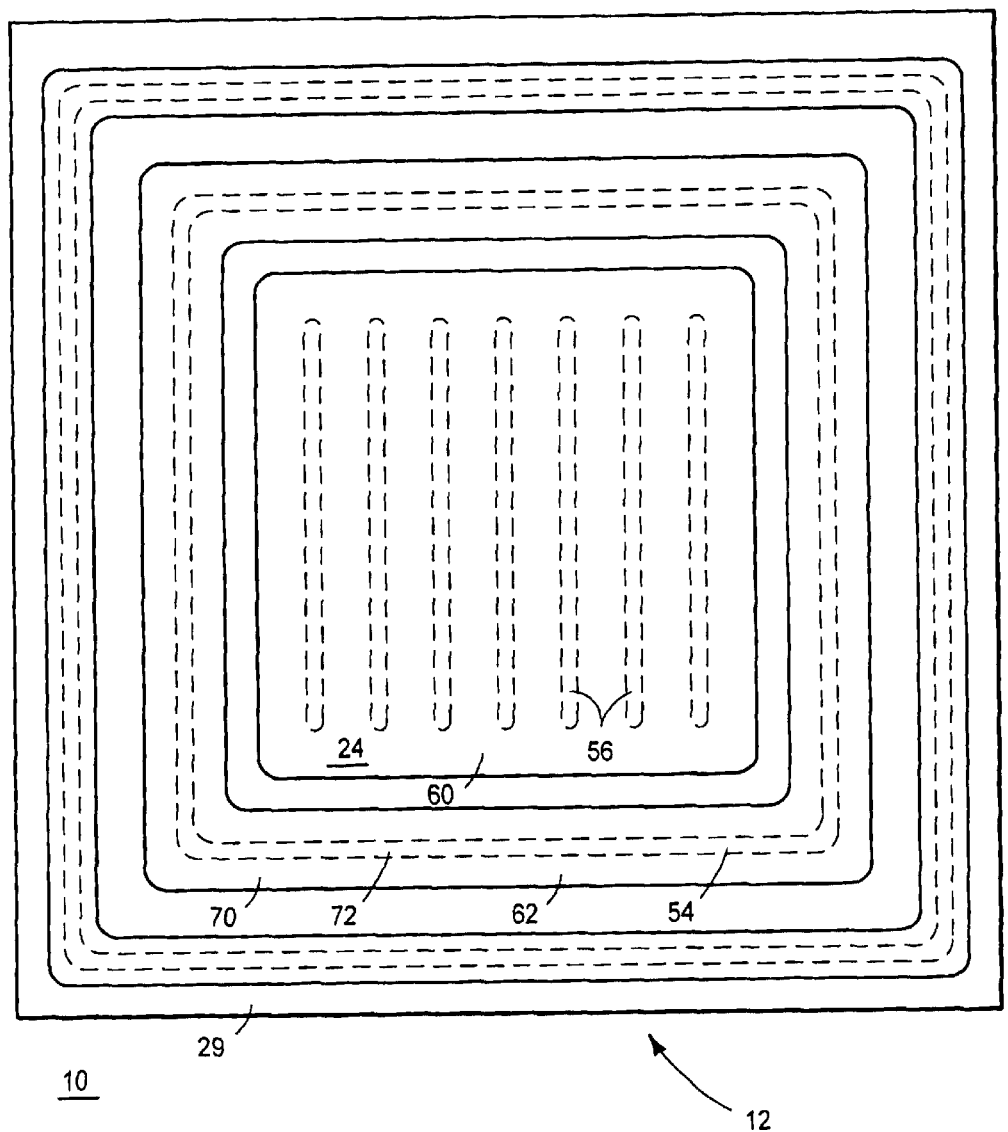
FIG. 5 is a top view of the semiconductor device showing features of the device layout.

FIG. 5 shows a simplified top view of semiconductor device 10 showing selected features of the vertical gate transistor layout. In this embodiment, pedestal structure 24 is formed over most of the central portion of substrate 12 with source contacts 56 arranged in multiple rows for contacting by source terminal 60 in a large region at the center of substrate 12 to provide a low on resistance. Gate terminal 62 is formed to surround source terminal 60 as shown and to contact semiconductor layer 21 at gate contact 54 to maintain vertical gates 40 at a constant potential.

In an embodiment where semiconductor device 10 is a high voltage device, a field termination structure is formed around the peripheral portions of substrate 12 using an additional photomask step. The field termination structure shapes electric fields resulting from high voltages applied to drain terminal 64 to prevent a localized breakdown that reduces the specified performance of semiconductor device 10.

In summary, the present invention provides a semiconductor device with a vertical gate to provide a fast switching speed and high frequency performance. A pedestal structure is formed on a top surface of a substrate. A conductive material (40) is disposed along a side surface (28) of the pedestal structure to self align an edge of a source electrode (45) of the semiconductor device. A dielectric spacer (55) is formed along a side surface (49) of the conductive material to self align a contact area (56) of the source electrode. A pedestal structure is formed with a single photomasking step and the gate, source and source contact are successively self aligned to a side surface or vertical wall of the pedestal structure. Hence, in an embodiment where the transistor is formed as a vertical power device with a drain terminal on a bottom surface of the substrate, the transistor can be fabricated using only four photomasking steps including forming the gate contact, metallization and passivation layers. One or more masking steps can be added to form field terminations for high voltage operation or a top surface drain terminal to configure the transistor as a planar device.

What is claimed is:

1. A transistor (10), comprising:
   a substrate (12) having a top surface (48) for forming a pedestal structure (24);
   a conductive material (40) disposed along a side surface (28) of the pedestal structure to define an edge of a first conduction electrode (45) within the substrate; and
   a dielectric spacer (55) formed along a side surface (49) of the conductive material to define a contact area (56) of the first conduction electrode.

2. The transistor of claim 1, wherein the substrate includes:
   a semiconductor layer (14, 16); and
   a first dielectric layer (18) formed over the semiconductor layer to support the pedestal structure, the conductive material and the dielectric spacer.

3. The transistor of claim 2, wherein a side surface of the dielectric spacer defines an opening in the first dielectric layer that exposes the semiconductor layer to form the contact area.

4. The transistor of claim 1, wherein the substrate is formed with a body region (31) having an edge (33) defined by the side surface of the pedestal structure.

5. The transistor of claim 4, wherein the conductive material inverts the body region to form a channel (50) at the top surface of the substrate.

6. The transistor of claim 5, further comprising a second conduction electrode (14, 64) of the transistor formed at a bottom surface (63) of the substrate.

7. The transistor of claim 1, wherein the pedestal structure includes:
   a second dielectric layer (19) formed on the top surface of the substrate;
   a third dielectric layer (20) formed on the second dielectric layer; and a
   conductive layer (21) formed with the conductive material on the third dielectric layer.

8. The transistor of claim 7, wherein the second dielectric layer includes silicon nitride.

9. The transistor of claim 7, wherein the third dielectric layer includes silicon dioxide.

10. The transistor of claim 7, wherein the conductive material includes polycrystalline silicon.

11. The transistor of claim 7, wherein the second dielectric layer has a horizontal surface adjacent to the top surface of the substrate and a vertical surface (32) recessed from a vertical surface of the second dielectric layer.

12. The transistor of claim 11, wherein the conductive material extends to the vertical surface of the second dielectric layer.

13. A semiconductor device (10), comprising:
   a substrate (12) having a top surface (48) for doping a source region (45) within the substrate and forming a channel (50) of the semiconductor device;
   a dielectric pedestal (19, 20) formed on the top surface;
   a control electrode (40) formed along a side surface (28) of the dielectric pedestal to define an edge of the source region; and
   a dielectric spacer (55) formed along a side surface (49) of the control electrode to define a contact area (56) of the source region.

14. The semiconductor device of claim 13, wherein the control electrode is extended over the dielectric pedestal to receive an external signal ($V_G$).

15. The semiconductor device of claim 13, wherein the dielectric spacer is formed with silicon dioxide.

16. A semiconductor device (10), comprising:
   a substrate (12);
   a first conductive material (40) disposed on a first surface (28) to define a conduction electrode (45) of the semiconductor device within the substrate and at a second surface (48) perpendicular to the first surface;
   a dielectric spacer (55) formed on a surface (49) of the first conductive material that runs parallel to the first surface to define a contact area (56) of the conduction electrode.

17. The semiconductor device of claim 16, further comprising:
   a semiconductor substrate (12) for providing the first surface; and
   a pedestal structure (24) disposed on the first surface and providing the second surface perpendicular to the first surface.

18. The semiconductor device of claim 17, wherein the pedestal structure includes a nitride layer (19) and a conductive layer (21) formed over the nitride layer for electrically contacting the conductive material.

19. The semiconductor device of claim 16, wherein the dielectric spacer is formed with silicon dioxide.

20. The semiconductor device of claim 16, wherein the conductive material comprises polycrystalline silicon.

* * * * *